United States Patent
Do et al.

(10) Patent No.: US 9,431,331 B2
(45) Date of Patent: Aug. 30, 2016

(54) SEMICONDUCTOR DEVICE AND METHOD OF FORMING PENETRABLE FILM ENCAPSULANT AROUND SEMICONDUCTOR DIE AND INTERCONNECT STRUCTURE

(71) Applicant: STATS ChipPAC, Ltd., Singapore (SG)

(72) Inventors: Byung Tai Do, Singapore (SG); Reza A. Pagaila, Tangerang (ID); Linda Pei Ee Chua, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 13/937,849

(22) Filed: Jul. 9, 2013

(65) Prior Publication Data

US 2013/0299971 A1 Nov. 14, 2013

Related U.S. Application Data

(62) Division of application No. 12/917,629, filed on Nov. 2, 2010, now Pat. No. 8,546,193.

(51) Int. Cl.
*H01L 23/50* (2006.01)
*H01L 23/498* (2006.01)
(Continued)

(52) U.S. Cl.
CPC ....... *H01L 23/49811* (2013.01); *H01L 21/568* (2013.01); *H01L 23/3128* (2013.01); *H01L 24/19* (2013.01); *H01L 24/96* (2013.01); *H01L 24/97* (2013.01); *H01L 25/105* (2013.01); *H01L 25/16* (2013.01); *H01L 25/50* (2013.01);
(Continued)

(58) Field of Classification Search
CPC ............... H01L 23/4012; H01L 25/50; H01L 23/49811; H01L 23/3128; H01L 25/105; H01L 21/568
USPC ............ 257/686, 737, 787, E23.116, E23.18
See application file for complete search history.

(56) References Cited

U.S. PATENT DOCUMENTS

| | | | |
|---|---|---|---|
| 7,018,866 B2 | 3/2006 | Sugaya et al. | |
| 7,187,068 B2 | 3/2007 | Suh et al. | |
| 7,550,680 B2* | 6/2009 | Pendse | 174/520 |
| 7,619,901 B2 | 11/2009 | Eichelberger et al. | |
| 8,069,558 B2* | 12/2011 | Hirayama et al. | 29/832 |

(Continued)

FOREIGN PATENT DOCUMENTS

| | | |
|---|---|---|
| CN | 1993809 A | 7/2007 |
| CN | 101752217 A | 6/2010 |
| TW | 200821643 A | 5/2008 |

*Primary Examiner* — Nathan Ha
(74) *Attorney, Agent, or Firm* — Robert D. Atkins; Patent Law Group: Atkins and Associates, P.C.

(57) ABSTRACT

A semiconductor device has a plurality of bumps formed over a carrier. A semiconductor die is mounted to the carrier between the bumps. A penetrable film encapsulant layer having a base layer, first adhesive layer, and second adhesive layer is placed over the semiconductor die and bumps. The penetrable film encapsulant layer is pressed over the semiconductor die and bumps to embed the semiconductor die and bumps within the first and second adhesive layers. The first adhesive layer and second adhesive layer are separated to remove the base layer and first adhesive layer and leave the second adhesive layer around the semiconductor die and bumps. The bumps are exposed from the second adhesive layer. The carrier is removed. An interconnect structure is formed over the semiconductor die and second adhesive layer. A conductive layer is formed over the second adhesive layer electrically connected to the bumps.

9 Claims, 10 Drawing Sheets

(51) Int. Cl.
*H01L 21/56* (2006.01)
*H01L 23/31* (2006.01)
*H01L 25/10* (2006.01)
*H01L 25/00* (2006.01)
*H01L 25/16* (2006.01)
*H01L 23/00* (2006.01)

(52) U.S. Cl.
CPC .............. *H01L21/561* (2013.01); *H01L 24/16* (2013.01); *H01L 24/20* (2013.01); *H01L 24/48* (2013.01); *H01L 2224/02379* (2013.01); *H01L 2224/0401* (2013.01); *H01L 2224/04105* (2013.01); *H01L 2224/12105* (2013.01); *H01L 2224/13024* (2013.01); *H01L 2224/16225* (2013.01); *H01L 2224/20* (2013.01); *H01L 2224/48091* (2013.01); *H01L 2224/73265* (2013.01); *H01L 2224/96* (2013.01); *H01L 2224/97* (2013.01); *H01L 2225/107* (2013.01); *H01L 2225/1035* (2013.01); *H01L 2225/1041* (2013.01); *H01L 2225/1052* (2013.01); *H01L 2225/1058* (2013.01); *H01L 2924/014* (2013.01); *H01L 2924/01005* (2013.01); *H01L 2924/01006* (2013.01); *H01L 2924/01013* (2013.01); *H01L 2924/01019* (2013.01); *H01L 2924/01029* (2013.01); *H01L 2924/01033* (2013.01); *H01L 2924/01047* (2013.01); *H01L 2924/01049* (2013.01); *H01L 2924/01073* (2013.01); *H01L 2924/01074* (2013.01); *H01L 2924/01079* (2013.01); *H01L 2924/01082* (2013.01); *H01L 2924/01322* (2013.01); *H01L 2924/12041* (2013.01); *H01L 2924/12042* (2013.01); *H01L 2924/1305* (2013.01); *H01L 2924/1306* (2013.01); *H01L 2924/13091* (2013.01); *H01L 2924/15311* (2013.01); *H01L 2924/15331* (2013.01); *H01L 2924/181* (2013.01); *H01L 2924/18162* (2013.01); *H01L 2924/3011* (2013.01)

(56) References Cited

U.S. PATENT DOCUMENTS

| | | | | |
|---|---|---|---|---|
| 8,097,490 | B1* | 1/2012 | Pagaila et al. | 438/106 |
| 8,143,101 | B2* | 3/2012 | Sun et al. | 438/109 |
| 8,158,888 | B2* | 4/2012 | Shen et al. | 174/260 |
| 8,188,585 | B2* | 5/2012 | Brunnbauer | H01L 21/568 257/686 |
| 8,409,923 | B2* | 4/2013 | Kim et al. | 438/109 |
| 8,536,462 | B1* | 9/2013 | Darveaux et al. | 174/260 |
| 8,546,932 | B1* | 10/2013 | Chung | 257/686 |
| 8,796,846 | B2* | 8/2014 | Lin | H01L 21/6835 257/686 |
| 9,030,010 | B2* | 5/2015 | Liang | H01L 23/49827 257/738 |
| 9,165,876 | B2* | 10/2015 | Lee | H01L 23/49816 |
| 2006/0006534 | A1* | 1/2006 | Yean et al. | 257/737 |
| 2006/0275952 | A1 | 12/2006 | Gowda et al. | |
| 2007/0141330 | A1 | 6/2007 | Morishima et al. | |
| 2008/0036065 | A1* | 2/2008 | Brunnbauer et al. | 257/686 |
| 2008/0157329 | A1* | 7/2008 | Inoue | 257/686 |
| 2008/0230887 | A1* | 9/2008 | Sun et al. | 257/686 |
| 2008/0280394 | A1* | 11/2008 | Murtuza et al. | 438/109 |
| 2008/0315385 | A1* | 12/2008 | Gerber et al. | 257/686 |
| 2009/0127680 | A1 | 5/2009 | Do et al. | |
| 2009/0146301 | A1* | 6/2009 | Shimizu et al. | 257/738 |
| 2009/0155956 | A1* | 6/2009 | Pohl et al. | 438/109 |
| 2009/0206461 | A1 | 8/2009 | Yoon | |
| 2009/0315164 | A1 | 12/2009 | Chow et al. | |
| 2010/0013065 | A1* | 1/2010 | Mistry et al. | 257/660 |
| 2010/0040986 | A1 | 2/2010 | Yamaguchi et al. | |
| 2010/0136275 | A1 | 6/2010 | Amano | |
| 2010/0140771 | A1 | 6/2010 | Huang et al. | |
| 2010/0258944 | A1* | 10/2010 | Uchiyama et al. | 257/773 |
| 2011/0057308 | A1 | 3/2011 | Choi et al. | |
| 2011/0089552 | A1* | 4/2011 | Park | H01L 21/568 257/686 |
| 2011/0089563 | A1* | 4/2011 | Kikuchi et al. | 257/738 |
| 2011/0140258 | A1 | 6/2011 | Do et al. | |
| 2011/0227209 | A1* | 9/2011 | Yoon et al. | 257/686 |
| 2011/0298109 | A1 | 12/2011 | Pagaila et al. | |
| 2012/0032341 | A1* | 2/2012 | Chao et al. | 257/774 |
| 2012/0061855 | A1* | 3/2012 | Do et al. | 257/778 |

* cited by examiner

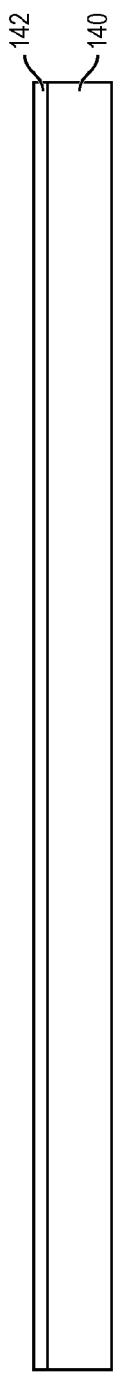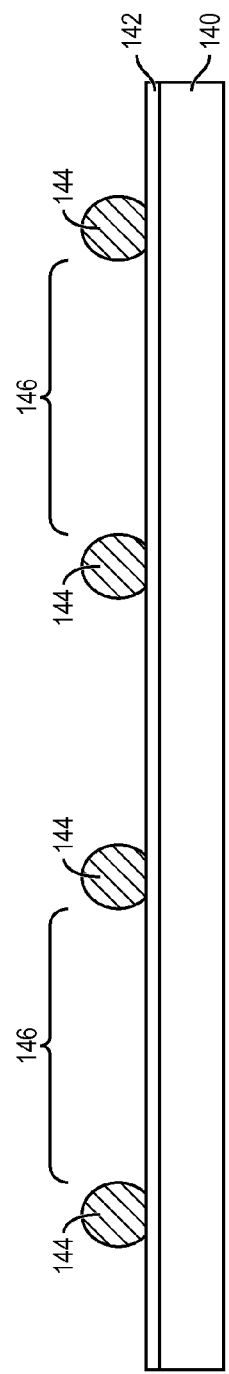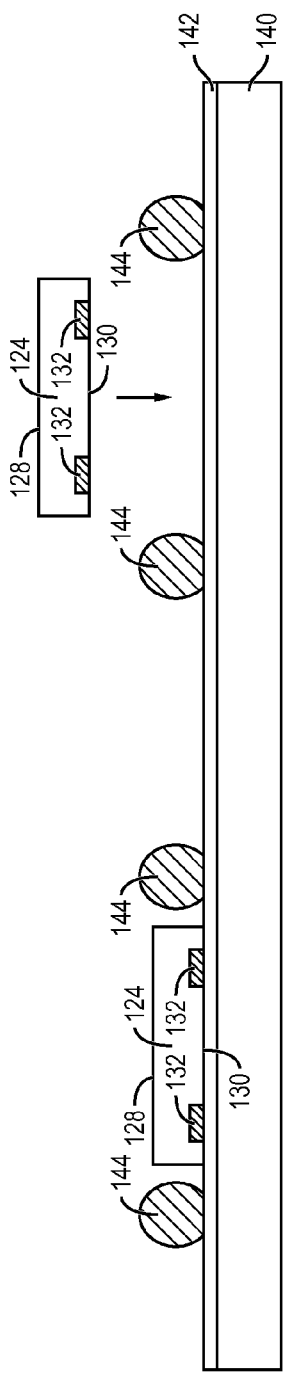

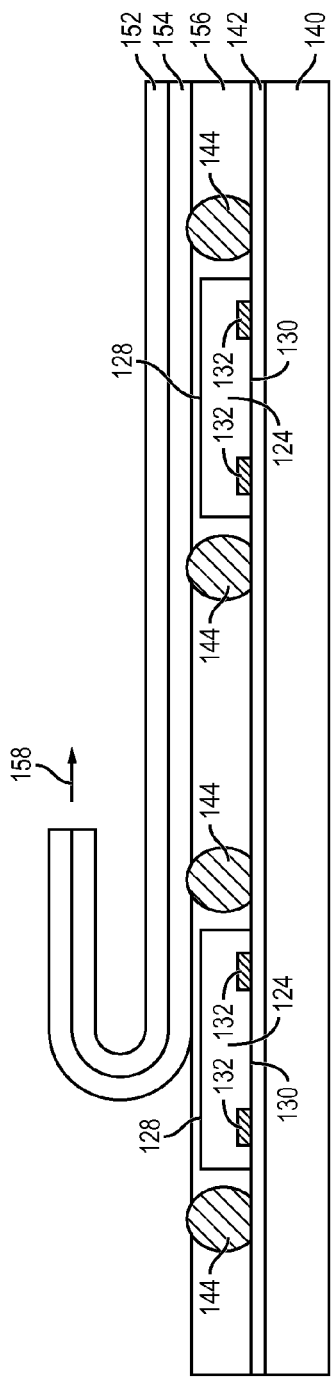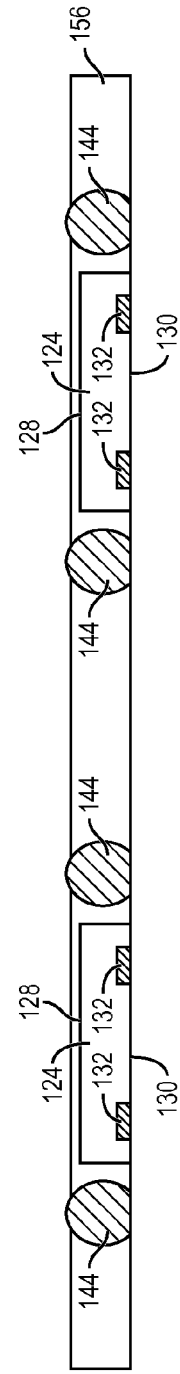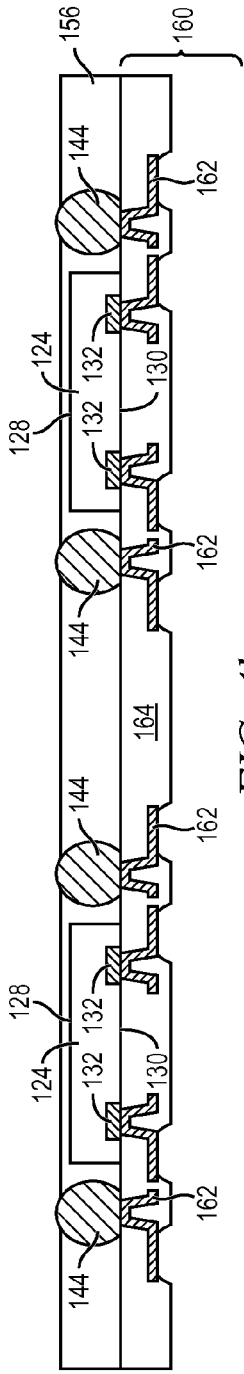

SEMICONDUCTOR DEVICE AND METHOD OF FORMING PENETRABLE FILM ENCAPSULANT AROUND SEMICONDUCTOR DIE AND INTERCONNECT STRUCTURE

CLAIM TO DOMESTIC PRIORITY

The present application is a division of U.S. patent application Ser. No. 12/917,629, now U.S. Pat. No. 8,546,193, filed Nov. 2, 2010, which application is incorporated herein by reference.

FIELD OF THE INVENTION

The present invention relates in general to semiconductor devices and, more particularly, to a semiconductor device and method of forming a penetrable film encapsulant around a semiconductor die and interconnect structure.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In a fan-out wafer level chip scale package (Fo-WLCSP), a semiconductor die is commonly mounted to a temporary carrier. An encapsulant is deposited over the semiconductor die and carrier, typically by mold injection. The carrier is removed to expose the semiconductor die, and a build-up interconnect structure is formed over the exposed semiconductor die.

The semiconductor die is known to vertically and laterally shift during encapsulation, particularly during mold injection, which can cause misalignment of the build-up interconnect structure. One technique of securing the semiconductor die to the carrier to reduce die shifting involves forming wettable pads over the carrier and securing the semiconductor die to the wettable pads with bumps. The formation of wettable pads typically involves photolithography, etching, and plating, which are time consuming and costly manufacturing processes. The wettable pads and bumps increase interconnect resistance between the semiconductor die and build-up interconnect structure.

A plurality of conductive vias or pillars is commonly formed through the encapsulant for z-direction vertical electrical interconnect to stacked semiconductor devices. The conductive vias are typically coplanar with the encapsulant. The minimal exposed surface area of the conductive via reduces joint reliability with the stacked semiconductor devices.

SUMMARY OF THE INVENTION

A need exists to reduce die shifting and improve joint reliability for stacked semiconductor devices. Accordingly, in one embodiment, the present invention is a semiconductor device comprising a semiconductor die and plurality of bumps disposed adjacent to the semiconductor die. A penetrable film layer is disposed over the semiconductor die and bumps to embed the semiconductor die and a first portion of bumps while leaving exposed a second portion of the bumps.

In another embodiment, the present invention is a semiconductor device comprising a semiconductor die and first interconnect structure disposed adjacent to the semiconductor die. A penetrable film layer is disposed over the semiconductor die and first interconnect structure to embed the semiconductor die and a first portion of first interconnect structure while leaving exposed a second portion of the first interconnect structure.

In another embodiment, the present invention is a semiconductor device comprising a semiconductor die and first interconnect structure disposed adjacent to the semiconductor die. A penetrable film layer is disposed over the semiconductor die and first interconnect structure to embed the semiconductor die and a portion of the first interconnect structure.

In another embodiment, the present invention is a semiconductor device comprising a semiconductor die and first interconnect structure disposed adjacent to the semiconductor die. A penetrable film layer is disposed over the semiconductor die and first interconnect structure while leaving exposed a portion of the first interconnect structure.

BRIEF DESCRIPTION OF THE DRAWINGS

FIGS. 4a-4l illustrate a process of forming a penetrable film encapsulant layer around a semiconductor die and interconnect structure;

DETAILED DESCRIPTION OF THE DRAWINGS

Figure 1:
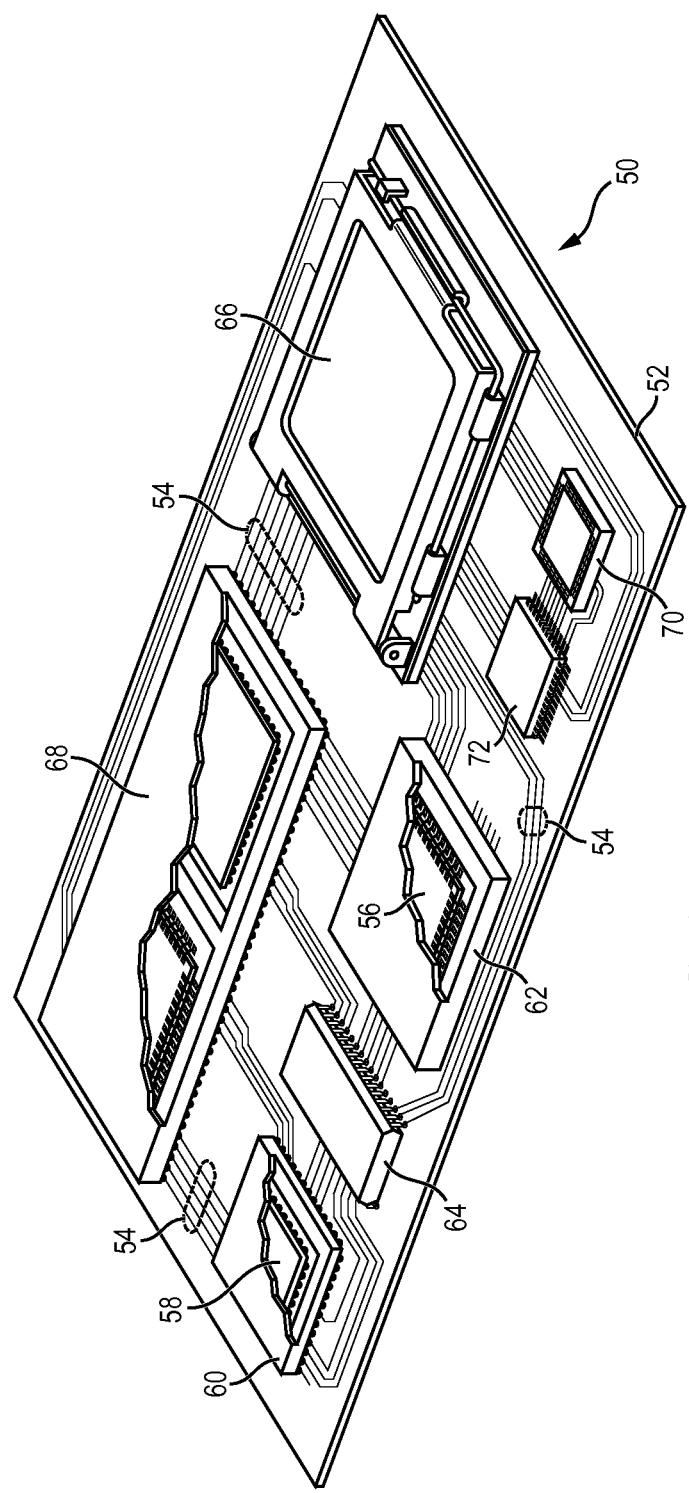
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
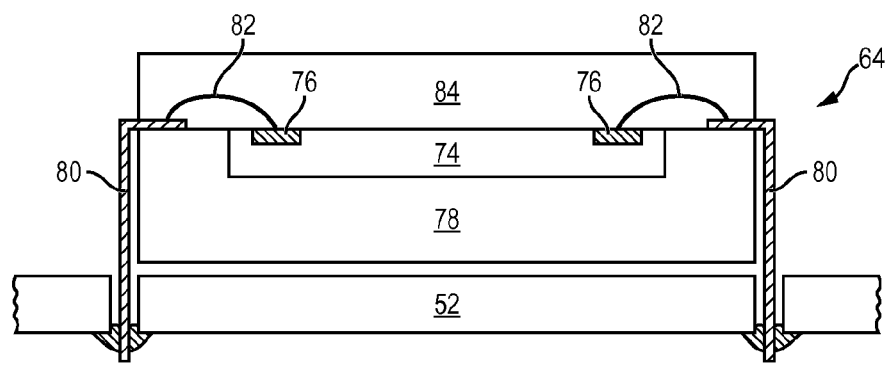
FIGS. 2a-2c illustrate further detail of the representative semiconductor packages mounted to the PCB.
Figure 2B:
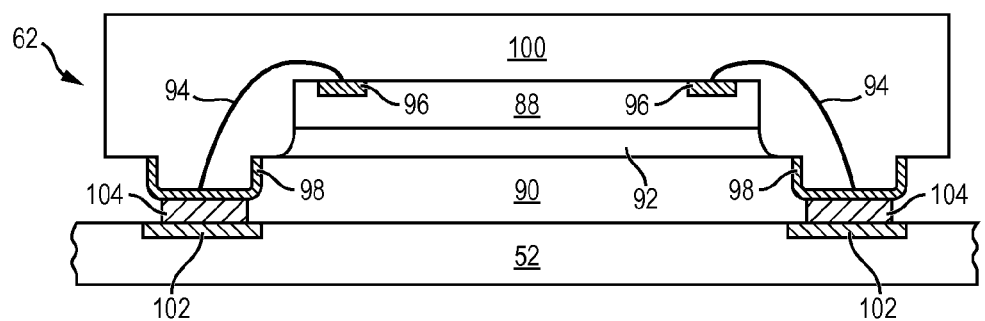
Figure 2C:
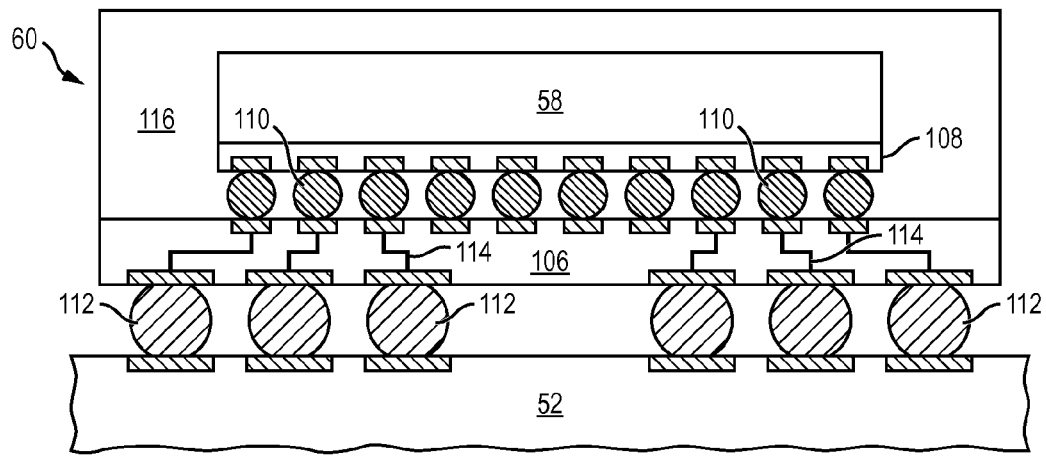

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
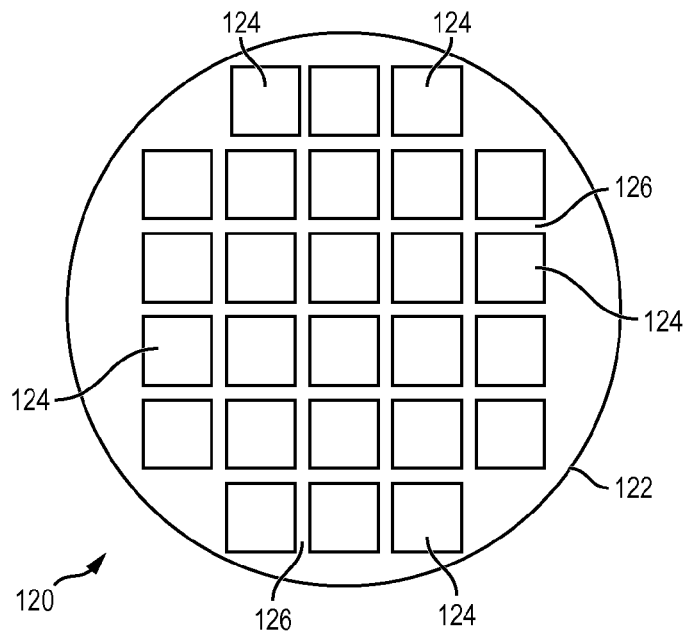
FIGS. 3a-3c illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 3B:
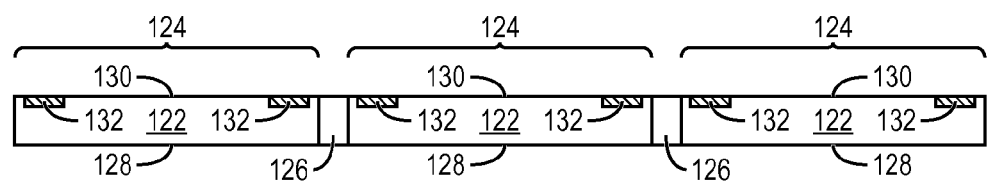

FIG. 3b shows a cross-sectional view of a portion of semiconductor wafer 120. Each semiconductor die 124 has a back surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

Figure 3C:
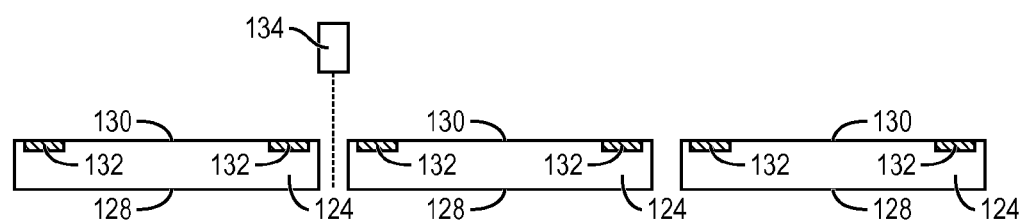

In FIG. 3c, semiconductor wafer 120 is singulated through saw street 126 using a saw blade or laser cutting tool 134 to separate the wafer into individual semiconductor die 124.

Figure 4D:
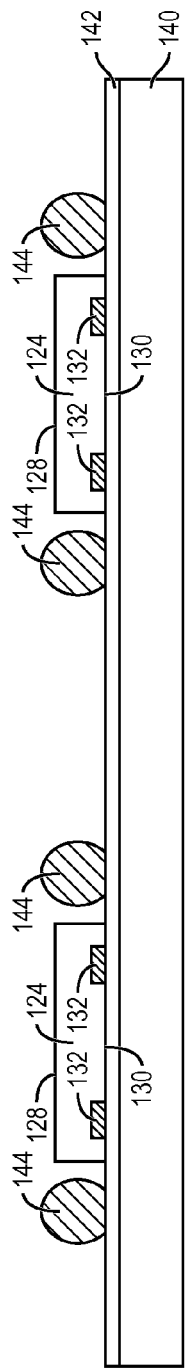

FIGS. 4a-4l illustrate, in relation to FIGS. 1 and 2a-2c, a process of forming a penetrable film encapsulant layer around a semiconductor die and interconnect structure. FIG. 4a shows a substrate or carrier 140 containing temporary or sacrificial base material such as silicon, polymer, beryllium oxide, or other suitable low-cost, rigid material for structural support. An interface layer or double-sided tape 142 is formed over carrier 140 as a temporary adhesive bonding film or etch-stop layer.

In FIG. 4b, an electrically conductive bump material is deposited over carrier 140 and interface layer 142 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. In one embodiment, the bump material is reflowed by heating the material above its melting point to form spherical balls or bumps 144. Bumps 144 are disposed around mounting site 146 designated for later mounted semiconductor die. Bumps 144 represent one type of z-direction vertical interconnect structure that can be formed over carrier 140. The interconnect structure can also use stud bump, micro bump, or other electrical interconnect.

Figure 4E:
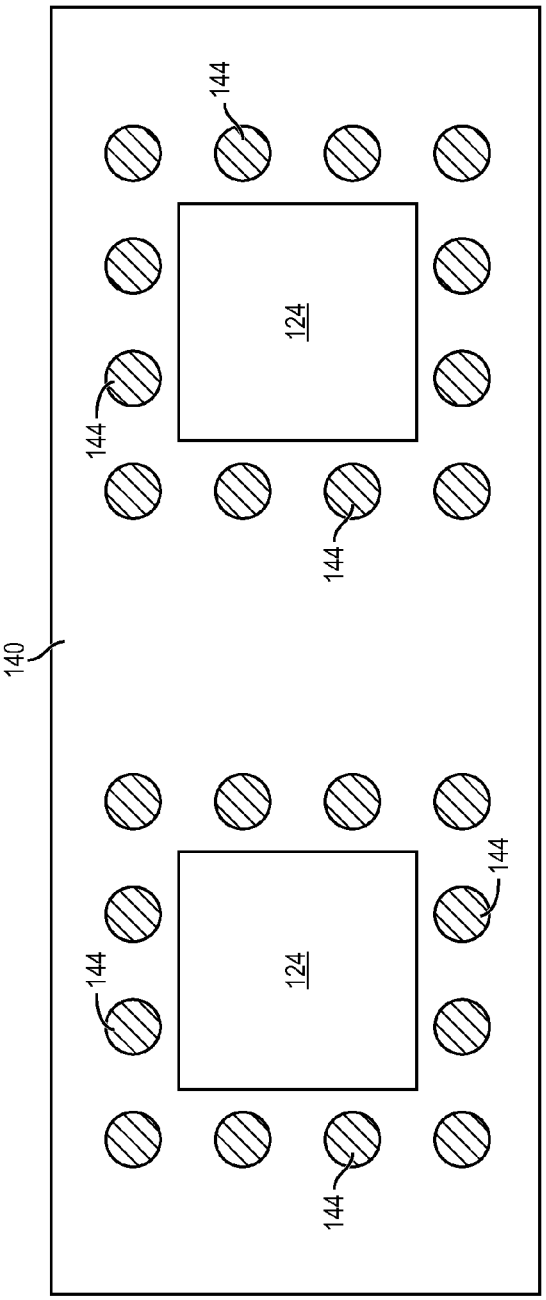

In FIGS. 4c-4d, semiconductor die 124 from FIGS. 3a-3c are mounted to sites 146 between bumps 144 using pick and place operation with active surface 130 oriented toward carrier 140 and interface layer 142. In one embodiment, semiconductor die 124 has a thickness of 450 micrometers (μm). Bumps 144 have a height greater than 450 μm to extend above back surface 128 of semiconductor die 124. FIG. 4e is a top view of bumps 144 formed around semiconductor die 124. Bumps 144 can be formed after mounting semiconductor die 124 to carrier 140.

Figure 4F:
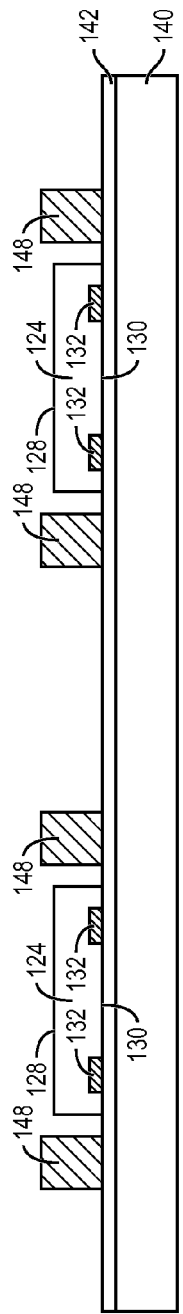

FIG. 4f shows an alternative embodiment with conductive pillars 148 formed over carrier 140 around semiconductor die 124. Conductive pillars 148 can be formed by depositing a photoresist layer over carrier 140, either prior to or after mounting semiconductor die 124, and then patterning the photoresist using photolithography to form vias in the pillar locations. The vias are filled with Al, Cu, Sn, Ni, Au, Ag, Ti, tungsten (W), poly-silicon, or other suitable electrically conductive material using electrolytic plating, electroless plating process, or other suitable metal deposition process. The photoresist is removed leaving z-direction vertical conductive pillars 148. Conductive pillars 148 extend above back surface 128 of semiconductor die 124.

Figure 4G:
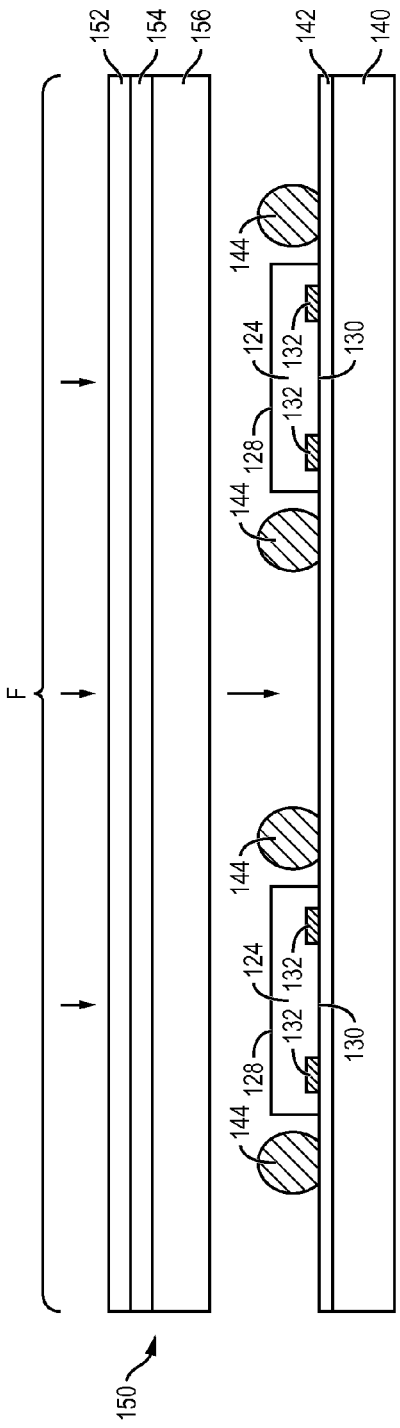

FIG. 4g shows a penetrable film encapsulant layer 150 including base layer 152, ultraviolet (UV) B-stage film adhesive layer 154, and thermo-setting adhesive film layer 156. In one embodiment, base layer 152 contains polyester, and UV B-stage film adhesive layer 154 contains acrylic polymer. The thermo-setting adhesive film layer 156 has a low coefficient of thermal expansion (CTE) of about 20-45 ppm/K and high modulus of about 1000-34000 MPa, for example as found in Denko AS-0001, AS-0016, and AS-0036 adhesive films. The penetrable film encapsulant layer 150 is heated to 70° C. to render adhesive layers 154 and 156 soft, malleable, and compliant.

Figure 4H:
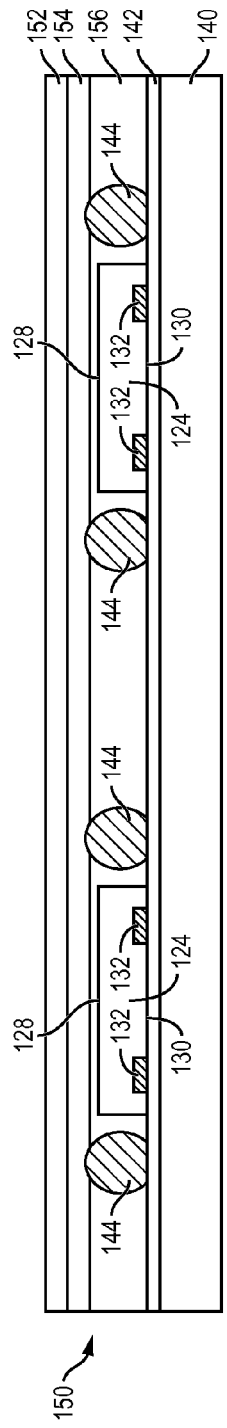

The penetrable film encapsulant layer 150 is placed over semiconductor die 124, bumps 144, and carrier 140. The penetrable film encapsulant layer 150 is pressed onto semiconductor die 124 and bumps 144 with a force F to cause the semiconductor die and bumps to penetrate into adhesive layers 154 and 156. The force F is removed after adhesive layer 156 comes into close proximity or touches a top surface of interface layer 142. FIG. 4h shows semiconductor die 124 and bumps 144 embedded into adhesive layers 154 and 156. Bumps 144 may or may not contact base layer 152. The penetrable film encapsulant layer 150 is cured to harden adhesive layer 156 and securely hold semiconductor die 124 and bumps 144.

In FIG. 4i, base layer 152 and UV B-stage film adhesive layer 154 are removed by mechanical peeling or mechanical lift-off in the direction of arrow 158. The B-stage film adhesive layer 154 separates under UV radiation while adhesive layer 156 remains around semiconductor die 124 and bumps 144 as an encapsulating layer for structural support and environmental protection of the semiconductor device from external elements and contaminants. Bumps 144 are exposed from adhesive layer 156 for external electrical interconnect. Base layer 152 and B-stage film adhesive layer 154 can also be removed by chemical etching, CMP, mechanical grinding, thermal bake, UV light, laser scanning, or wet stripping.

In FIG. 4j, carrier 140 and interface layer 142 are removed by chemical etching, mechanical peeling, CMP, mechanical grinding, thermal bake, UV light, laser scanning, or wet stripping to expose active surface 130 and bumps 144.

In FIG. 4k, a bottom-side build-up interconnect structure 160 is formed over active surface 130 of semiconductor die 124 and adhesive layer 156. The build-up interconnect structure 160 includes an electrically conductive layer 162 formed using a patterning and metal deposition process such as sputtering, electrolytic plating, and electroless plating. Conductive layer 162 can be one or more layers of Al, Cu, Sn, Ni, Au, Ag, or other suitable electrically conductive material. One portion of conductive layer 162 is electrically connected to bumps 144. Another portion of conductive layer 162 is electrically connected to contact pads 132 of semiconductor die 124. Other portions of conductive layer 162 can be electrically common or electrically isolated depending on the design and function of the semiconductor device.

The build-up interconnect structure 160 further includes an insulating or passivation layer 164 formed between conductive layers 162 for electrical isolation. The insulating layer 164 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 164 is formed using PVD, CVD, printing, spin coating, spray coating, sintering or thermal oxidation. A portion of insulating layer 164 is removed by an etching process to expose conductive layer 162.

Figure 4L:
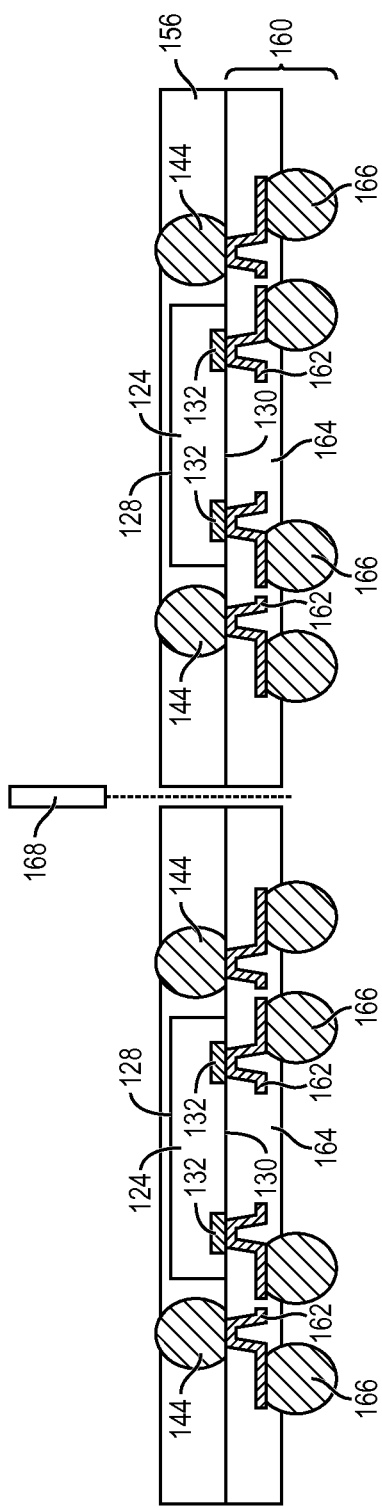

In FIG. 4*l*, an electrically conductive bump material is deposited over build-up interconnect structure 160 and electrically connected to the exposed conductive layer 162 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 162 using a suitable attachment or bonding process. In one embodiment, the bump material is reflowed by heating the material above its melting point to form spherical balls or bumps 166. In some applications, bumps 166 are reflowed a second time to improve electrical contact to conductive layer 162. The bumps can also be compression bonded to conductive layer 162. Bumps 166 represent one type of interconnect structure that can be formed over conductive layer 162. The interconnect structure can also use bond wires, stud bump, micro bump, or other electrical interconnect.

Figure 5:
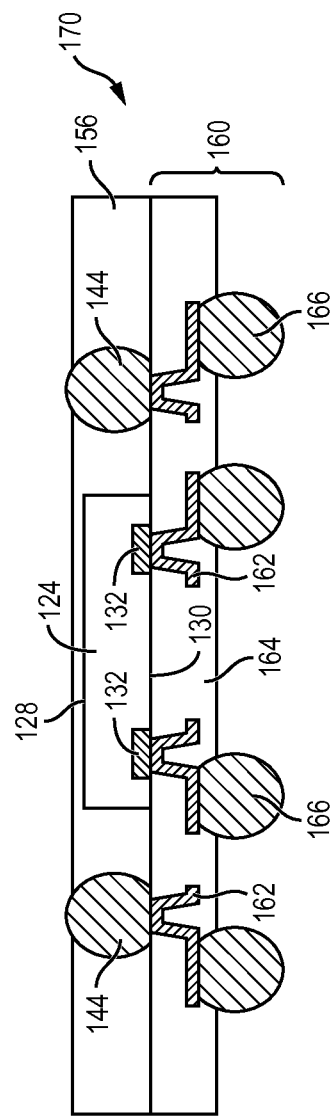
FIG. 5 illustrates the Fo-WLCSP with the penetrable film encapsulant layer formed around the semiconductor die and interconnect structure.

Semiconductor die 124 are singulated with saw blade or laser cutting tool 168 into individual Fo-WLCSP 170. FIG. 5 shows Fo-WLCSP 170 after singulation. Semiconductor die 124 is electrically connected to build-up interconnect structure 160 and bumps 144 and 166. The penetrable film encapsulant layer 150 with adhesive layer 154 and 156 pressed onto semiconductor die 124 and bumps 144 reduces lateral and vertical die shifting. After removing base layer 152 and UV B-stage film adhesive layer 154, adhesive layer 156 remains around semiconductor die 124 and bumps 144 as an encapsulating layer for structural support and environmental protection of the semiconductor device from external elements and contaminants. By pressing adhesive layer 156 over semiconductor die 124 and bumps 144 as the encapsulating layer, there is no injection of encapsulant as found in the prior art to cause die shifting.

Figure 6:
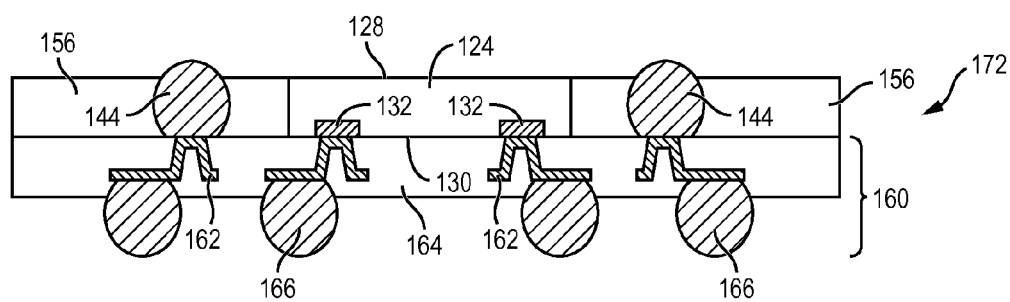
FIG. 6 illustrates the penetrable film encapsulant layer coplanar with the semiconductor die.

FIG. 6 shows an embodiment of WLCSP 172, similar to FIG. 5, with adhesive layer 156 coplanar with back surface 128 of semiconductor die 124.

Figure 7:
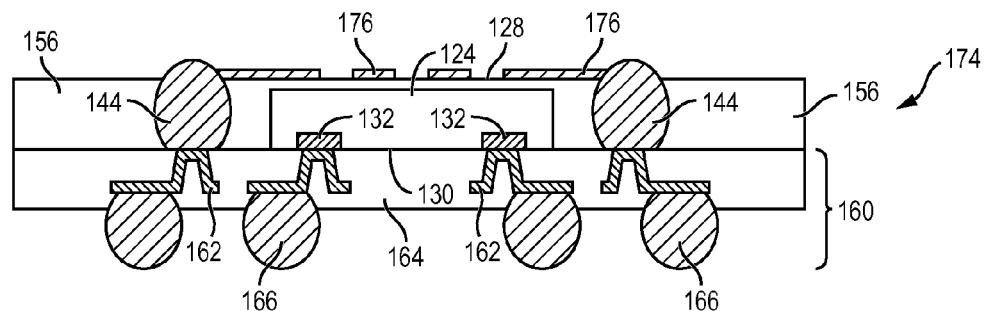
FIG. 7 illustrates an RDL formed over the penetrable film encapsulant layer.

FIG. 7 shows an embodiment of WLCSP 174, similar to FIG. 5, with an electrically conductive layer or redistribution layer (RDL) 176 formed over adhesive layer 156 using a patterning and metal deposition process such as sputtering, electrolytic plating, and electroless plating. Conductive layer 176 can be one or more layers of Al, Cu, Sn, Ni, Au, Ag, or other suitable electrically conductive material. The curing process of thermo-setting adhesive layer 156 enables high temperature metal deposition. One portion of conductive layer 176 is electrically connected to bumps 144. Other portions of conductive layer 176 can be electrically common or electrically isolated depending on the design and function of the semiconductor device.

Figure 8:
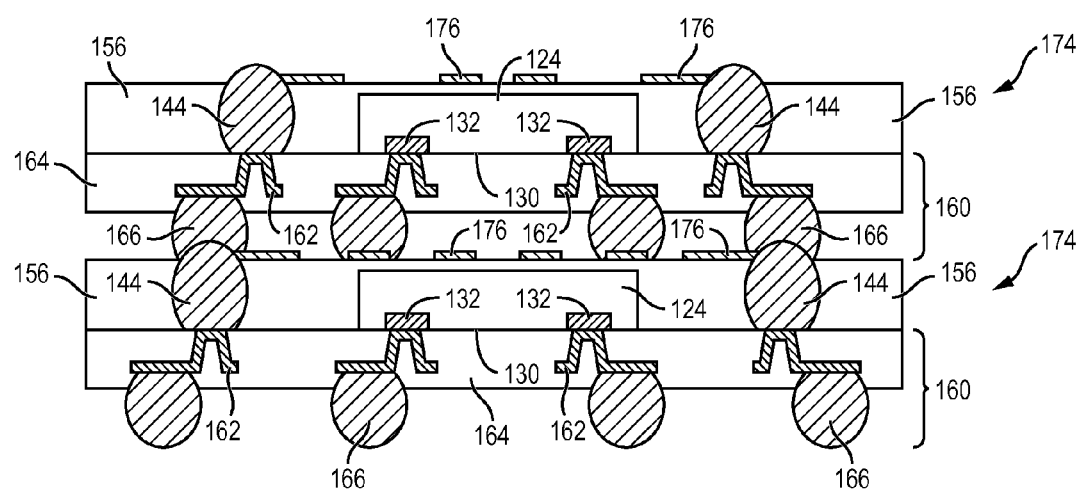
FIG. 8 illustrates stacked Fo-WLCSP each with the penetrable film encapsulant layer formed around the semiconductor die and interconnect structure.

FIG. 8 shows a plurality of stacked Fo-WLCSP 170 electrically connected by bumps 144, build-up interconnect structure 160, and RDL 176. With bumps 144 extending above adhesive layer 156, there is more contact surface area and higher joint reliability for vertical electrical interconnect to adjacent Fo-WLCSP 170.

Figure 9:
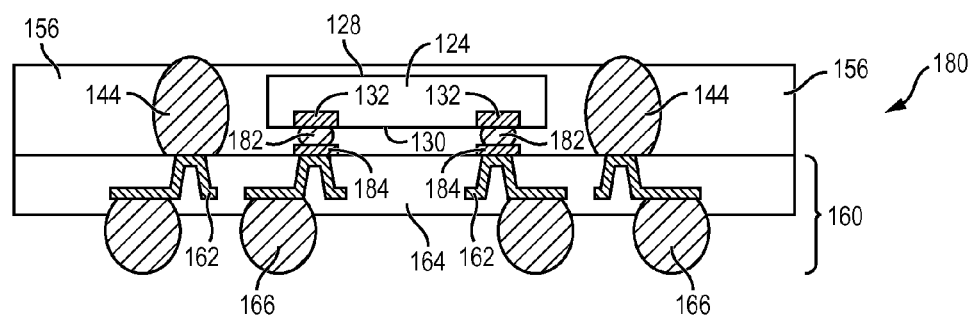
FIG. 9 illustrates bumps formed over contact pads on the semiconductor die.

FIG. 9 shows an embodiment of WLCSP 180, similar to FIG. 5, with bumps 182 formed on contact pads 132. Contact pads 184 are formed over interface layer 142 prior to mounting semiconductor die 124, e.g. during the processing steps of FIG. 4*b*. Semiconductor die 124 with bumps 182 is mounted to contact pads 184, similar to FIG. 4*c*.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a semiconductor die;
   a plurality of bumps disposed adjacent to the semiconductor die; and
   a multi-layer film encapsulant including,
   (a) a thermo-setting adhesive film layer pressed over the semiconductor die and in contact with the bumps to embed the semiconductor die and a first portion of the bumps,
   (b) a ultraviolet B-stage film adhesive layer in contact with a first surface of the thermo-setting adhesive film layer with a second portion of the bumps extending into the ultraviolet B-stage film adhesive layer, and
   (c) a base layer in contact with a surface of the ultraviolet B-stage film adhesive layer opposite the thermo-setting adhesive film layer.

2. The semiconductor device of claim 1, wherein a second surface of the thermo-setting adhesive film layer opposite the first surface of the thermo-setting adhesive film layer is coplanar with a surface of the semiconductor die.

3. A semiconductor device, comprising:
   a semiconductor die;
   a first interconnect structure disposed adjacent to the semiconductor die; and
   a multi-layer film encapsulant including,
   (a) a thermo-setting adhesive film layer disposed over the semiconductor die and first interconnect structure to embed the semiconductor die and a first portion of the first interconnect structure,
   (b) a ultraviolet B-stage film adhesive layer in contact with a first surface of the thermo-setting adhesive film layer with a second portion of the first interconnect structure extending into the ultraviolet B-stage film adhesive layer, and
   (c) a base layer in contact with a surface of the ultraviolet B-stage film adhesive layer opposite the thermo-setting adhesive film layer.

4. The semiconductor device of claim 3, wherein the first interconnect structure includes a bump or a conductive pillar.

5. The semiconductor device of claim 3, wherein a second surface of the thermo-setting adhesive film layer opposite the first surface of the thermo- setting adhesive film layer is coplanar with a surface of the semiconductor die.

6. A semiconductor device, comprising:
   a semiconductor die;
   a first interconnect structure disposed adjacent to the semiconductor die; and
   a multi-layer film encapsulant including,
   (a) a penetrable film layer disposed over the semiconductor die and first interconnect structure to embed the semiconductor die and a first portion of first interconnect structure, the penetrable film layer coplanar with a first and second surface of the semiconductor die, (b) a film adhesive layer in contact with a surface of the penetrable film layer with a second portion of the first interconnect structure extending into the film adhesive layer, and (c) a base layer in contact with a surface of the film adhesive layer opposite the penetrable film layer.

7. The semiconductor device of claim 6, wherein the first interconnect structure includes a bump or a conductive pillars.

8. A semiconductor device, comprising:

a semiconductor die;

a first interconnect structure disposed adjacent to the semiconductor die; and a multi-layer film encapsulant including, (a) a penetrable film layer pressed over the semiconductor die and first interconnect structure to embed the semiconductor die and a first portion of the first interconnect structure, (b) a film adhesive layer in contact with a surface of the penetrable film layer with a second portion of the first interconnect structure extending into the film adhesive layer, and (c) a base layer in contact with a surface of the film adhesive layer opposite the penetrable film layer.

9. The semiconductor device of claim 8, wherein the first interconnect structure includes a bump or a conductive pillar.

\* \* \* \* \*